(12) United States Patent
Dershem

(10) Patent No.: US 8,063,161 B2
(45) Date of Patent: Nov. 22, 2011

(54) LOW TEMPERATURE CURING ACRYLATE AND MALEIMIDE BASED FORMULATIONS AND METHODS FOR USE THEREOF

(75) Inventor: Stephen M. Dershem, San Diego, CA (US)

(73) Assignee: Designer Molecules, Inc., San Diego, CA (US)

( * ) Notice: Subject to any disclaimer, the term of this patent is extended or adjusted under 35 U.S.C. 154(b) by 0 days.

(21) Appl. No.: 12/595,616

(22) PCT Filed: Apr. 14, 2008

(86) PCT No.: PCT/US2008/060269
§ 371 (c)(1),
(2), (4) Date: Oct. 12, 2009

(87) PCT Pub. No.: WO2008/130894
PCT Pub. Date: Oct. 30, 2008

(65) Prior Publication Data
US 2010/0063184 A1 Mar. 11, 2010

Related U.S. Application Data

(60) Provisional application No. 60/922,961, filed on Apr. 12, 2007.

(51) Int. Cl.
*C09J 4/00* (2006.01)
*C08F 22/40* (2006.01)

(52) U.S. Cl. ......... 526/262; 526/313; 526/286; 526/321

(58) Field of Classification Search .................. 526/262, 526/286, 313, 321, 323.1
See application file for complete search history.

(56) References Cited

U.S. PATENT DOCUMENTS

| | | |
|---|---|---|
| 3,905,820 A | 9/1975 | Frass |
| 4,075,167 A | 2/1978 | Takamizawa et al. |
| 4,111,879 A | 9/1978 | Mori et al. |
| 4,224,216 A | 9/1980 | Locatelli et al. |
| 4,395,462 A | 7/1983 | Polmanteer |
| 4,705,716 A | 11/1987 | Tang |
| 4,894,281 A | 1/1990 | Yagi et al. |
| 4,968,738 A | 11/1990 | Dershem |
| 5,045,127 A | 9/1991 | Dershem et al. |
| 5,064,480 A | 11/1991 | Dershem et al. |
| 5,087,705 A | 2/1992 | Okada et al. |
| 5,155,177 A | 10/1992 | Frihart |
| 5,232,962 A | 8/1993 | Dershem et al. |
| 5,266,610 A | 11/1993 | Malhotra et al. |
| 5,284,959 A | 2/1994 | Marien et al. |
| 5,306,333 A | 4/1994 | Dershem et al. |
| 5,315,011 A | 5/1994 | Benicewicz et al. |
| 5,358,992 A | 10/1994 | Dershem et al. |
| 5,393,887 A | 2/1995 | Petit |
| 5,403,389 A | 4/1995 | Dershem |
| 5,412,053 A | 5/1995 | Lichtenhan et al. |
| 5,430,112 A | 7/1995 | Sakata et al. |
| 5,447,988 A | 9/1995 | Dershem et al. |
| 5,484,867 A | 1/1996 | Lichtenhan et al. |
| 5,489,641 A | 2/1996 | Dershem |
| 5,554,769 A | 9/1996 | Sheppard et al. |
| 5,567,761 A | 10/1996 | Song |
| 5,602,205 A | 2/1997 | Singh et al. |
| 5,646,241 A | 7/1997 | Dershem et al. |
| 5,714,086 A | 2/1998 | Osuna et al. |
| 5,717,034 A | 2/1998 | Dershem et al. |
| 5,718,941 A | 2/1998 | Dershem et al. |
| 5,753,748 A | 5/1998 | Dershem et al. |
| 5,760,165 A | 6/1998 | Dao et al. |
| 5,861,111 A | 1/1999 | Dershem et al. |
| 5,969,036 A | 10/1999 | Dershem |
| 5,973,166 A | 10/1999 | Mizori et al. |
| 6,034,150 A | 3/2000 | Hoyle et al. |
| 6,034,194 A | 3/2000 | Dershem |
| 6,034,195 A | 3/2000 | Dershem |
| 6,063,828 A | 5/2000 | Ma et al. |
| 6,087,447 A | 7/2000 | Stevens et al. |
| 6,121,358 A | 9/2000 | Dershem et al. |
| 6,174,977 B1 * | 1/2001 | Ariyoshi et al. ............... 526/194 |
| 6,187,886 B1 | 2/2001 | Husson et al. |
| 6,211,320 B1 | 4/2001 | Dershem et al. |

(Continued)

FOREIGN PATENT DOCUMENTS
CN 1187507 A 7/1998
(Continued)

OTHER PUBLICATIONS

"Heat-proof photosensitive resin composite—composed of pgfo. organpjsilsesquioxane and photosensitisiog agcut", Derwent-ACC-No. 1990-159265 Abstracted-Pub-No. JP 02099955A.
International Search Report for PCT/US08/60269, Aug. 15, 2008.
Andersson et al., "Initiator-Free Photopolymerization of an Aliphatic Vinyl Ether-Maleimide Monomer", *J Coatings Tech 69*: 1997, 91-95.
Chen et al., "Interfacial Properties of Metal/Polyimide Layered Strucutres", In *Micro Electronic Packaging Technology—Materials and Processes* (Shieh ed; ASM International, Metals Park, Ohio) 1989, 345-350.
DSM "Hybrane (TM) DSM's new dendritic polymers", *DSM New Business Development product literature 99-1c*, 1999, 1-10.
Fouassier "Photoinitiation, Photopolymerization, and Photocuring", *Hanser/Gardner* 1995, 276-283.
Grenier-Loustalot et al., "Monofunctional maleimide or acetylene tennlnated model compounds-I. Molten state homopolymerization reactivity and kinetics", *European Polymer Journal 34*: 1998, 1705-1714.
Iizawa et al., "Regioselective reaction of oxiranes with S-Phenyl Thioesters catalyzed by quaternary onium salts or crown ether-metal salt compleses", *Bull Chem Soc Jpn:62*: 1989, 597-8.

(Continued)

*Primary Examiner* — David W Wu
*Assistant Examiner* — Vu A Nguyen
(74) *Attorney, Agent, or Firm* — The Law Office of Jane K. Babin, Professional Corporation; Jane K. Babin

(57) ABSTRACT

The present invention is based on the discovery that certain electron poor olefins combined with nucleophiles and a base catalyst are useful as adhesive compositions for the electronic packaging industry. In particular, the adhesive formulations set forth herein are useful as low temperature curing formulations with high adhesion to a variety of substrates. Invention formulations typically cure at about 80° C. and have a potlife of about 24 hours. The formulations cure by the well-known Michael addition reaction.

20 Claims, No Drawings

U.S. PATENT DOCUMENTS

| | | | |
|---|---|---|---|
| 6,214,516 B1 | 4/2001 | Waterson et al. |
| 6,214,923 B1 | 4/2001 | Goto et al. |
| 6,265,530 B1 | 7/2001 | Herr et al. |
| 6,281,314 B1 | 8/2001 | Tong et al. |
| 6,300,456 B1 | 10/2001 | Musa |
| 6,316,566 B1 | 11/2001 | Ma et al. |
| 6,355,750 B1 | 3/2002 | Herr |
| 6,369,124 B1 | 4/2002 | Hoyle et al. |
| 6,423,780 B1 | 7/2002 | Dershem et al. |
| 6,429,281 B1 | 8/2002 | Dershem et al. |
| 6,437,080 B1 | 8/2002 | McGrail et al. |
| 6,482,899 B2 | 11/2002 | Ohashi et al. |
| 6,514,664 B1 | 2/2003 | Touky et al. |
| 6,521,716 B1 * | 2/2003 | Leake .................. 525/421 |
| 6,521,731 B2 | 2/2003 | Dershem et al. |
| 6,610,808 B2 | 8/2003 | De et al. |
| 6,620,946 B2 | 9/2003 | Dershem et al. |
| 6,699,929 B2 | 3/2004 | Musa et al. |
| 6,716,919 B2 | 4/2004 | Lichtenhan et al. |
| 6,743,852 B2 | 6/2004 | Dershem et al. |
| 6,750,301 B1 | 6/2004 | Bonneau et al. |
| 6,790,597 B2 | 9/2004 | Dershem |
| 6,825,245 B2 | 11/2004 | Dershem |
| 6,831,132 B2 | 12/2004 | Liu et al. |
| 6,852,814 B2 | 2/2005 | Dershem et al. |
| 6,855,745 B2 | 2/2005 | Hoyle et al. |
| 6,881,820 B1 | 4/2005 | Meador et al. |
| 6,908,957 B2 | 6/2005 | Musa et al. |
| 6,916,856 B2 | 7/2005 | Dershem |
| 6,946,523 B2 | 9/2005 | Dershem et al. |
| 6,960,636 B2 | 11/2005 | Dershem et al. |
| 6,963,001 B2 | 11/2005 | Dershem et al. |
| 7,102,015 B2 | 9/2006 | Dershem et al. |
| 7,119,160 B2 | 10/2006 | Kodama et al. |
| 7,157,587 B2 | 1/2007 | Mizori et al. |
| 7,176,044 B2 | 2/2007 | Forray et al. |
| 7,199,249 B2 | 4/2007 | Liu et al. |
| 7,208,566 B2 | 4/2007 | Mizori et al. |
| 7,285,613 B2 | 10/2007 | Dershem et al. |
| 7,309,724 B2 | 12/2007 | Dershem et al. |
| 7,517,925 B2 | 4/2009 | Dershem et al. |
| 7,678,879 B2 | 3/2010 | Dershem |
| 2002/0002238 A1 | 1/2002 | Laplante et al. |
| 2002/0010281 A1 | 1/2002 | Musa et al. |
| 2002/0062923 A1 | 5/2002 | Forray |
| 2002/0099168 A1 | 7/2002 | Dershem et al. |
| 2002/0188137 A1 | 12/2002 | Dershem et al. |
| 2002/0193541 A1 | 12/2002 | Dershem et al. |
| 2002/0198356 A1 | 12/2002 | Dershem et al. |
| 2003/0008992 A1 | 1/2003 | Dershem et al. |
| 2003/0055121 A1 | 3/2003 | Dershem et al. |
| 2003/0060531 A1 | 3/2003 | Dershem et al. |
| 2003/0068567 A1 | 4/2003 | Ono et al. |
| 2003/0083436 A1 | 5/2003 | Deitch |
| 2003/0087999 A1 | 5/2003 | Dershem et al. |
| 2003/0109666 A1 | 6/2003 | Dershem et al. |
| 2003/0125551 A1 | 7/2003 | Dershem et al. |
| 2003/0129438 A1 | 7/2003 | Becker et al. |
| 2003/0148226 A1 | 8/2003 | Kodama et al. |
| 2003/0166746 A1 | 9/2003 | Zhou et al. |
| 2003/0178138 A1 | 9/2003 | Tsukagoshi |
| 2003/0199638 A1 | 10/2003 | Liu et al. |
| 2003/0208016 A1 | 11/2003 | Dershem et al. |
| 2004/0006166 A1 | 1/2004 | Liu et al. |
| 2004/0019224 A1 | 1/2004 | Dershem et al. |
| 2004/0023926 A1 | 2/2004 | Guennouni et al. |
| 2004/0077798 A1 | 4/2004 | Dershem et al. |
| 2004/0082724 A1 | 4/2004 | Dershem et al. |
| 2004/0102566 A1 | 5/2004 | Forray et al. |
| 2004/0123948 A1 | 7/2004 | Dershem et al. |
| 2004/0225026 A1 | 11/2004 | Mizori et al. |
| 2004/0225045 A1 | 11/2004 | Forray |
| 2004/0225059 A1 | 11/2004 | Mizori et al. |
| 2005/0027082 A1 * | 2/2005 | Narayan-Sarathy et al. . 525/471 |
| 2005/0107542 A1 | 5/2005 | Liu et al. |
| 2005/0119362 A1 | 6/2005 | Ishikawa |
| 2005/0136620 A1 | 6/2005 | Dershem et al. |
| 2005/0137277 A1 | 6/2005 | Dershem et al. |
| 2005/0267254 A1 | 12/2005 | Mizori et al. |
| 2005/0272888 A1 | 12/2005 | Dershem et al. |
| 2006/0009578 A1 | 1/2006 | Dershem |
| 2006/0063014 A1 | 3/2006 | Forray |
| 2006/0069232 A1 | 3/2006 | Dershem |
| 2006/0074196 A1 | 4/2006 | Lewandowski et al. |
| 2006/0089447 A1 | 4/2006 | Robertson et al. |
| 2006/0116476 A1 | 6/2006 | Cheng |
| 2006/0142517 A1 | 6/2006 | Dershem |
| 2007/0021533 A1 | 1/2007 | Yan et al. |
| 2007/0060683 A1 | 3/2007 | Musa et al. |
| 2007/0155869 A1 | 7/2007 | Dershem et al. |
| 2007/0205399 A1 | 9/2007 | Mizori |
| 2007/0299154 A1 | 12/2007 | Dershem et al. |
| 2008/0017308 A1 | 1/2008 | Dershem et al. |
| 2008/0075961 A1 | 3/2008 | Mizori |
| 2008/0075963 A1 | 3/2008 | Dershem |
| 2008/0075965 A1 | 3/2008 | Dershem |
| 2008/0103240 A1 | 5/2008 | Dershem |
| 2008/0142158 A1 | 6/2008 | Dershem |
| 2008/0146738 A1 | 6/2008 | Dershem |
| 2008/0160315 A1 | 7/2008 | Forray et al. |
| 2008/0191173 A1 | 8/2008 | Dershem et al. |
| 2008/0210375 A1 | 9/2008 | Dershem et al. |
| 2008/0251935 A1 | 10/2008 | Dershem |
| 2008/0257493 A1 | 10/2008 | Dershem |
| 2008/0262191 A1 | 10/2008 | Mizori |
| 2009/0061244 A1 | 3/2009 | Dershem |
| 2009/0215940 A1 | 8/2009 | Dershem |
| 2009/0288768 A1 | 11/2009 | Dershem |
| 2010/0041803 A1 | 2/2010 | Dershem |
| 2010/0041823 A1 | 2/2010 | Dershem |
| 2010/0041832 A1 | 2/2010 | Dershem |
| 2010/0041845 A1 | 2/2010 | Dershem et al. |
| 2010/0056671 A1 | 3/2010 | Dershem |

FOREIGN PATENT DOCUMENTS

| | | |
|---|---|---|
| EP | 0393713 | 6/1994 |
| EP | 1156036 | 11/2001 |
| JP | 2-99955 | 4/1990 |
| JP | 2003002919 | 1/2003 |
| WO | WO-8604073 | 7/1986 |
| WO | WO-9406862 | 3/1994 |
| WO | WO-03080720 | 10/2003 |
| WO | WO-2004060330 | 7/2004 |
| WO | 2004099331 | 11/2004 |
| WO | WO-2004099331 | 11/2004 |
| WO | WO-2005003231 | 1/2005 |
| WO | WO-2005121190 | 12/2005 |
| WO | WO-2007100329 | 9/2007 |
| WO | WO-2008077141 | 6/2008 |
| WO | WO-2008092168 | 7/2008 |
| WO | WO-2008124797 | 10/2008 |
| WO | WO-2008130894 | 10/2008 |
| WO | WO-2010019832 | 2/2010 |

OTHER PUBLICATIONS

Klang "Radiation-curable Hyperbranched Polyester Acrylates", *PCI Magazine* Apr. 2007, 98-101.

Kohli et al., "Co-Polymerization of Maleimides and Vinyl Ethers: A Structural Study", *Macromolecules 31*: 1998, 5681-5689.

Krishnan et al., "Synthesis, Characterization, and Curing Kinetics of Novel Ladder-Like Polysilsesquioxanes Containing Side-Chain Maleimide Groups", *Journal of Polymer Science: Part A: Polymer Chemistry*. vol. 42: 2004, 4036-4016.

Pyriadi et al., "Cyclopolyimerization of N-allylimaleimide Polymer", *Polymer Preprints 11*: 1970, 60-65.

Tamaki et al., "Octa(aminophenyl)silsesquioxane as a Nanoconstruction Site", *J. Am. Chem. Soc*, lot. 123, No. 49. 2001 2001, 2416-12417.

Yamazaki et al., "Effect of N-substrtuents on polymerization reactivity of N-alkylitaconimides in radical polymerization", *European Polymer Journal 33*: 1997, 157-162.

* cited by examiner

LOW TEMPERATURE CURING ACRYLATE AND MALEIMIDE BASED FORMULATIONS AND METHODS FOR USE THEREOF

RELATED APPLICATIONS

The present application claims the benefit of priority under 35 U.S.C. §119 to U.S. Provisional Application No. 60/922,961, filed Apr. 12, 2007, the contents of which is incorporated herein by reference in its entirety.

FIELD OF THE INVENTION

The present invention relates to thermosetting adhesive compositions, methods of preparation and uses therefor. In particular, the present invention relates to low temperature curing thermosetting compositions and methods for use thereof.

BACKGROUND OF THE INVENTION

As the electronics industry advances and production of light weight components increases, the development of new materials gives producers increased options for further improving the performance and ease of manufacture of such components. Adhesive compositions are used for a variety of purposes in the fabrication and assembly of semiconductor packages and microelectronic devices. The more prominent uses include bonding of electronic elements such as integrated circuit chips to lead frames or other substrates, and bonding of surface mount components to printed circuit boards.

Adhesives useful for electronic packaging applications typically exhibit properties such as good mechanical strength, curing properties that do not affect the component or the carrier, and rheological properties compatible with application to microelectronic and semiconductor components. Examples of such packages are ball grid array (BGA) assemblies, super ball grid arrays, IC memory cards, chip carriers, hybrid circuits, chip-on-board, multi-chip modules, pin grid arrays, and the like.

Commercially available adhesives for low temperature cure applications are generally two part epoxy/polythiol compositions. Two part systems are cumbersome to work with due to the short pot-life once the two components are mixed together. Furthermore, in situ mixing of the two components can be inconsistent and unreliable, and is not practical for large-scale manufacturing application. The demand for one-part systems with adequate room temperature stability for several hours to 1 day or more is very high.

Currently available one-part adhesive systems contain an epoxy, a polythiol, and a latent curing accelerator. These systems necessarily employ glycidyl ether and/or glycidyl ester epoxies as these are the only epoxies that are sufficiently reactive with thiol curatives to be practical as adhesives. Both glycidyl ethers and esters are known for their residual chlorine content. Even the "cleanest" versions of these monomers contain around 50 ppm of total chloride. However, chloride ions are a potent source of corrosion in electronic components and thus, many applications of adhesive compositions are intolerant of chloride. Thus, one-part adhesive systems have limited usefulness in many of the most important electronics applications.

The microelectronics industry continues to require new resins that are able to meet its varying demands. There is thus a need for the development of new materials to address the requirements of this rapidly evolving industry.

SUMMARY OF THE INVENTION

The present invention provides adhesive compositions containing an electron poor olefin, a nucleophile, and a base catalyst, where the composition cure by Michael addition at a temperature of about 50° C. to about 100° C. In certain embodiments, the composition cures at a temperature of less than about 100° C., less than about 90° C., less than about 80° C., or less than about 70° C.

In one embodiment of the invention, the electron poor olefin in the adhesive composition contains at least one acrylate, methacrylate, or maleimide. In certain embodiments, the (meth)acrylate and/or maleimide contains at least two functional end groups per molecule.

Typically, the ratio of acrylate and methacrylate and maleimide equivalents to thiol equivalents in the composition is about 0.5 to about 1.5. In certain embodiments, the ratio is about 0.75 to about 1.3.

The acrylate can, for example, be a zinc diacrylate, an ethoxylated bisphenol A diacrylate, a trimethylolpropane trimethacrylate, or a tricyclodecanedimethanol diacrylate.

The maleimide can, for example, be 1,5-bismaleimido-2 methyl pentane, 1,6-bismaleimido-trimethyl hexane having the structure:

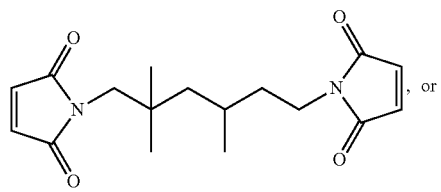

, or

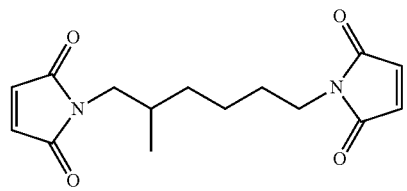

In other embodiments, the electron poor olefin includes at least one of: an ethoxylated bisphenol A diacrylate; a dimer diol diacrylate; a cyclohexanedimethanol diacrylate; a 2-butyl-2-ethyl-1,3-propanediol diacrylate; a 1,6-hexanediol diacrylate; a trimethylene glycol diacrylate; a tetraethylene glycol diacrylate; a polyethylene glycol diacrylate; a 1,4-butanediol diacrylate; a diethylene glycol diacrylate; a neopentyl glycol diacrylate; a propoxylated neopentyl glycol diacrylate; a tricyclodecanedimethanol diacrylate; a tris (2-hydroxyethyl)isocyanurate triacrylate; a pentaerythritol triacrylate; a ethoxylated trimethylolpropane triacrylate; a propoxylated trimethylolpropane triacrylate; a glyceryl triacrylate; a propoxylated glyceryl triacrylate; a trimethylolpropane trimethacrylate; a trimethylolpropane triacrylate; a pentaerythritol triacrylate; an ethoxylated trimethylolpropane triacrylate; a propoxylated trimethylolpropane triacrylate; a glyceryl triacrylate; a propoxylated glyceryl triacrylate; a trimethylolpropane trimethacrylate; a trimethylolpropane triacrylate; a pentaerythritol tetraacrylate; a di-trimethylolpropane tetraacrylate; a dipentaerythritol pentaacrylate; a 1,6-bismaleimido-2,2,4-trimethylhexane; a 1,5-bismaleimido-2-methylpentane; a 1,12-bismaleimidododecane; a dimer diamine bismaleimide; a zinc diacrylate; a zinc dimaleimidoundecanoate; a zinc dimaleimidocaproate; a zinc maleimidoundecanoate-acrylate mixed salt; a zinc maleimidocaproate-acrylate mixed salt; a zinc maleimidoundecanoate maleimdocaproate mixed salt; a calcium diacrylate; a calcium dimaleimidoundecanoate; a calcium dimaleimidocaproate; a calcium maleimidoundecanoate-acrylate mixed salt; a calcium maleimidocaproate-acrylate mixed salt; and a calcium maleimidoundecanoate maleimdocaproate mixed salt.

Non-limiting examples of electron poor olefins according to the invention include compounds having the formulae:

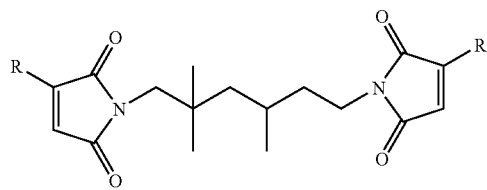

where R is H or methyl;

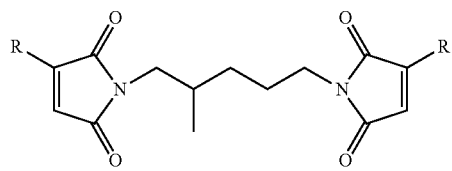

wherein R is H or methyl;
where R is H or methyl;

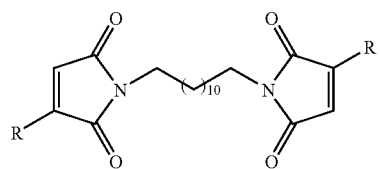

wherein R is H or methyl;
where R is H or methyl;

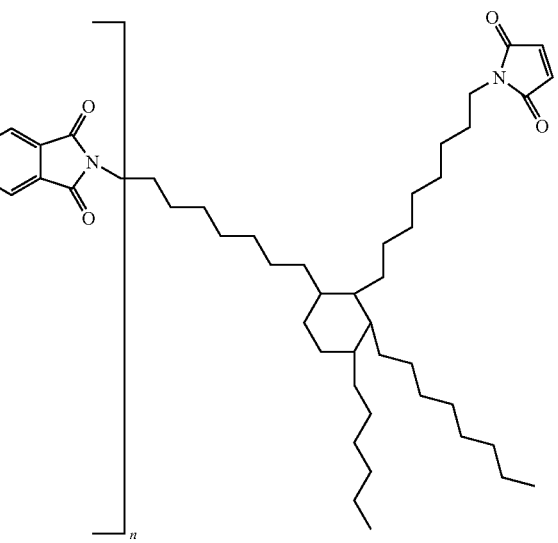

where R is H or methyl, m is 1 to about 10, and n is 3 to about 20;

where n is 0 to about 20;

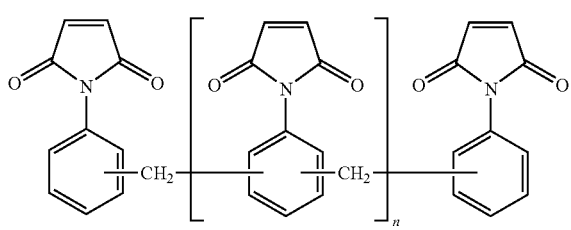

where n is 0 to about 50; and

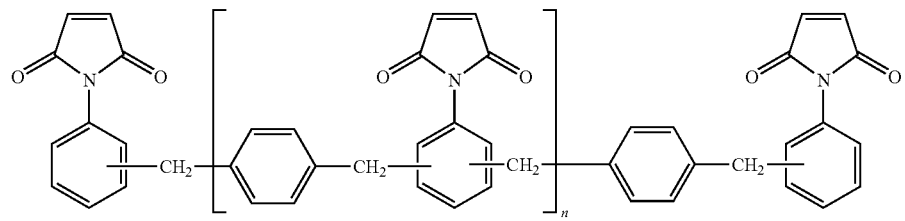

where n is 0 to about 50.

The nucleophile in the adhesive compositions of the invention typically includes at least one of: a thiol, a phenol and a malonate. In certain embodiments, the thiol is a compound synthesized from 2-mercaptoethanol, 2-mercaptoacetic acid, or 3-mercaptopropionic acid. In other embodiments, the nucleophile includes a polythiol with at least two thiol groups, or a polyphenol having two or more phenol groups.

The polythiol can be, for example, trimethylolpropane tri (3-mercaptopropionate); trimethylolpropane tris-(thioglycolate); pentaerythritol tetrakis-(thioglycolate); ethyleneglycol dithioglycolate; trimethylolpropane tris-(β-thiopropionate); pentaerythritol tetrakis-(β-thiopropionate); dipentaerythritol poly(β-thiopropionate); tris(3-mercaptopropionate)triethyl-1,3,5-triazine-2,4,6-(1H,3H,5H)-trione; dimer diol bis(3-mercaptopropionate); tricyclodecanedimethanol bis(3-mercaptopropionate; cyclohexanedimethanol bis(3-mercaptopropionate); or 2-butyl-2-ethyl-1,3-propanediol bis(3-mercaptopropionate).

In other embodiments, the thiol includes at least one compound having a formula:

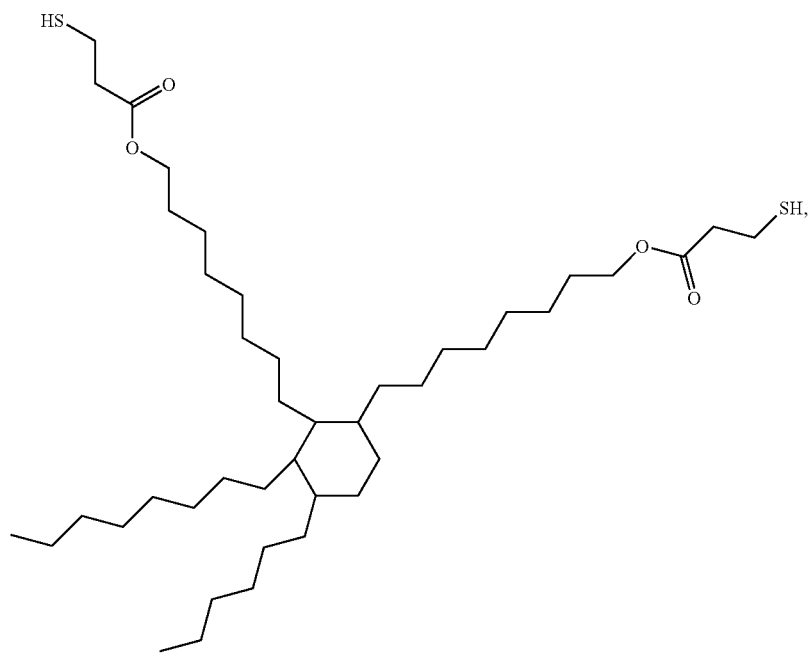

C-6

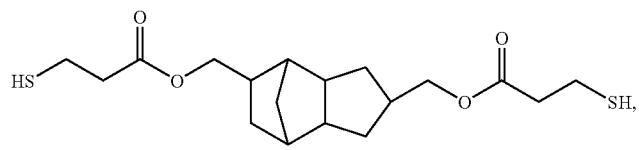

C-7

-continued

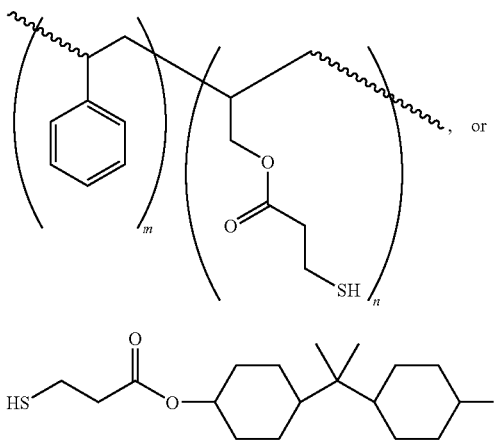

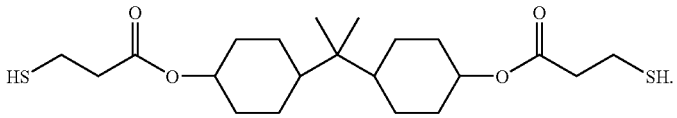

According to certain embodiments, the nucleophile of the adhesive composition of the invention is a trimethylolpropane tri(3-mercaptopropionate); a 2,2'-diallyl bisphenol A; an ortho,ortho-diallyl bisphenol F; a 2,2'-diallyl bisphenol E; a 1,1,1-tris(4-hydroxyphenyl)ethane; a 1,1,1-tris(4-hydroxyphenyl)methane; a polyphenol trimethylolpropane tri(3-mercaptopropionate) or a non-crystalline novolac resin.

Turning to the base catalyst, this component of the adhesive composition is typically an amine and often a latent amine. The latent amine can be a primary amine; a secondary amine; a tertiary amine; or an amine, an imidazole, or a hydrazide comprising at least one tertiary amino residue in its backbone. In other embodiments, the latent amine can be a micronized polyamine superficially treated with acid. In yet further embodiments, the amine is selected from: dimethylaminopropylamine; diethylaminopropylamine; di-propylaminopropylamine; dibutylaminopropylamine; dimethylaminoethylamine; diethylaminoethylamine; N-methylpiperazine; 2-methylimidazole; 2-ethylimidazole; 2-ethyl-4-methylimidazole; 2-phenylimidazole); 2-dimethylaminoethanol; 1-methyl-2-dimethylaminoethanol; 1-phenoxymethyl-2-dimethylaminoethanol; 2-diethylaminoethanol; 1-butoxymethyl-2-dimethylaminoethanol; 1-(2-hydroxy-3-phenoxypropyl)-2-methylimidazole; 1-(2-hydroxy-3-phenoxypropyl)-2-ethyl-4-methylimidazole; 1-(2-hydroxy-3-butoxypropyl)-2-methylimidazole; 1-(2-hydroxy-3-butoxypropyl)-2-ethyl-4-methylimidazole; 1-(2-hydroxy-3-phenoxypropyl)-2-phenylimidazoline; 1-(2-hydroxy-3-butoxypropyl)-2-methylimidazoline; 2-(dimethylaminomethyl)phenol; 2,4,6-tris(dimethylaminomethyl)phenol; N-β-hydroxyethylmorpholine; 2-dimethylaminoethanethiol; 2-mercaptopyridine; 2-mercaptobenzoimidazole; 2-mercaptobenzothiazole; 4-mercaptopyridine; N,N-dimethylaminobenzoic acid; N,N-dimethylglycine; nicotinic acid; isonicotinic acid; picolinic acid; N,N-dimethylglycine hydrazide; N,N-dimethylpropionic acid hydrazide; nicotinic acid hydrazide; and isonicotinic acid hydrazide.

In yet other aspects of the invention, the amine catalyst is converted to a salt by the addition of an acid compound, such as a carboxylic acid.

In certain embodiments, the latent amine is about 0.5 to about 5 parts by weight per 100 parts of the adhesive composition. Latent amines of the invention may act by initiating a Michael addition reaction between the electron poor olefin and the nucleophile only upon melting.

Advantageously, the working life of the adhesive compositions of the invention is typically at least about 10 hours, and most often at least about 24 hours.

According to certain embodiments of the invention the adhesive compositions also contain, for example, reactive diluents, such as an epoxy, a maleimide, an acrylate, a methacrylate, or a styrenic. The adhesive compositions can also contain fillers, such as conductive fillers (e.g., thermally conductive and/or electrically conductive fillers).

Also provided by the invention are adhesive compositions containing 0.5 wt %) to about 98 wt % of at least one electron poor olefin/nucleophile/base catalyst adhesive composition as described above; 0 wt % to about 90 wt % of a filler; and 0 wt % to about 4 wt %, of at least one coupling agent. Such compositions are useful as die attach paste adhesives.

In certain embodiments, these die attach paste adhesive composition include about 2 wt % to about 80 wt % of the at least one electron poor olefin/nucleophile/base catalyst adhesive composition, or may contain about 50 wt % of the electron poor olefin/nucleophile/base catalyst adhesive composition.

The adhesives of the invention can also include up to 90 wt % of at least one compound selected from an epoxy, a phenolic, a novolac, a bismaleimide, a polymaleimide, a cyanate ester; a vinyl ether, a vinyl ester, an olefin, a styrenic, an allyl functional compound, a thixotrope, a colorant, an oxazoline, a benzoxazine, an oxetane, a titanate, a zirconate, a silicate ester, and metal acrylate salt.

Fillers in the die attach paste adhesive compositions of the invention can include silver, silver coated copper, nickel, copper, aluminum, palladium, gold, graphite, metal-coated graphite, graphite, aluminum nitride, silicon carbide, boron nitride, diamond dust, alumina, a polysiloxane, silica, fumed silica, alumina, titanium dioxide, and calcium carbonate.

In other embodiments, the adhesive compositions of the invention include a coupling agent, such as a silicate ester, a metal acrylate salt, zirconate, a titanate, sulfur-containing silicate ester, a (meth)acrylate containing silicate ester, a maleimide containing silicate ester, a citraconimide containing silicate ester, or an epoxy containing silicate ester.

Also provided by the invention are assemblies having a first article permanently adhered to a second article by a cured aliquot of an adhesive composition of the invention.

In yet other embodiments, the invention provides methods for attaching a first article to a second article including the steps of applying an adhesive composition according to the invention to the first article, the second article or both the first article and the second article; contacting the first article and the second article to form an assembly where the first article and the second article are separated only by the applied adhesive composition; and curing the applied adhesive composition.

In certain embodiments of the invention, the articles are a semiconductor device and a substrate. The methods of the invention for attaching these generally use the die attach paste adhesive compositions and involve applying the adhesive composition of the invention to the substrate, the semiconductor device or both the substrate and the semiconductor device; contacting the substrate and the semiconductor device to form an assembly where the substrate and the die are separated only by the applied adhesive composition; and curing the applied adhesive composition.

In yet another aspect, the invention provides methods for adhesively attaching a semiconductor device to a substrate by applying an adhesive composition of the invention to the substrate, the semiconductor device or both the substrate and the semiconductor device; melting the applied adhesive composition; contacting the die and the substrate, where the die and substrate are separated only by the melted applied adhesive composition; and curing the applied adhesive composition, thereby attaching the semiconductor device to the substrate.

DETAILED DESCRIPTION OF THE INVENTION

Unless specific definitions are provided, the nomenclatures utilized in connection with, and the laboratory procedures and techniques of analytical chemistry, synthetic organic and inorganic chemistry described herein are those known in the art. Standard chemical symbols are used interchangeably with the full names represented by such symbols. Thus, for example, the terms "hydrogen" and "H" are understood to have identical meaning.

The laboratory procedures and techniques of analytical chemistry and synthetic organic chemistry described herein are those known in the art. Standard techniques may be used for chemical syntheses, chemical analyses, and formulation. The foregoing techniques and procedures can be generally performed according to conventional methods well known in the art.

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting.

The section headings used herein are for organizational purposes only and are not to be construed as limiting the subject matter described.

DEFINITIONS

"About" as used herein means that a number referred to as "about" comprises the recited number plus or minus 1-10% of that recited number. For example, "about" 100 degrees can mean 95-105 degrees or as few as 99-101 degrees depending on the situation. Whenever it appears herein, a numerical range such as "1 to 20" refers to each integer in the given range; e.g., "1 to 20 carbon atoms" means that an alkyl group can contain only 1 carbon atom, 2 carbon atoms, 3 carbon atoms, etc., up to and including 20 carbon atoms, although the term "alkyl" also includes instances where no numerical range of carbon atoms is designated).

As used herein, the term "maleimido" refers to a compound bearing at least one moiety having the structure:

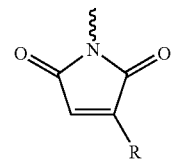

where R is H or lower alkyl.

"Imide" as used herein, refers to a functional group having two carbonyl groups bound to a primary amine or ammonia. The general formula of an imide of the invention is:

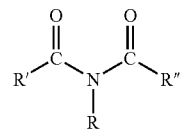

"Polyimides" are polymers of imide-containing monomers. Polyimides typically have one of two forms: linear or cyclic. Non-limiting examples of linear and cyclic (e.g. an aromatic heterocyclic polyimide) polyimides are shown below for illustrative purposes.

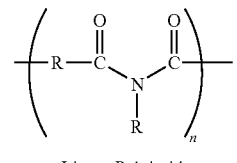

Linear Polyimide

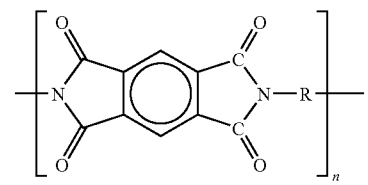

Aromatic Heterocyclic Polyimide

"Maleimide," as used herein, refers to an N-substituted maleimide having the formula as shown below:

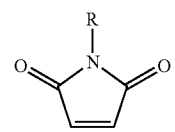

where the "R" group may be an aromatic, heteroaromatic, aliphatic, or polymeric moiety.

As used herein, the term "acrylate" refers to a compound bearing at least one moiety having the structure:

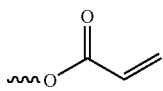

As used herein, the term "acrylamide" refers to a compound bearing at least one moiety having the structure:

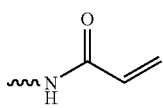

As used herein, the term "methacrylate" refers to a compound bearing at least one moiety having the structure:

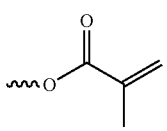

As used herein, the term "methacrylamide" refers to a compound bearing at least one moiety having the structure:

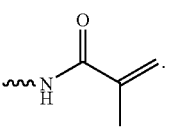

As used herein "epoxy" refers to a thermosetting epoxide polymer that cures by polymerization and crosslinking when mixed with a catalyzing agent or "hardener," also referred to as a "curing agent" or "curative." Epoxies of the present invention include, but are not limited to aliphatic, cycloaliphatic, glycidyl ether, glycidyl ester, glycidyl amine epoxies, and the like, and combinations thereof. Epoxies of the invention include compounds bearing at least one moiety having the structure:

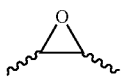

As used herein, the term "oxetane" refers to a compound bearing at least one moiety having the structure:

As used herein, the term "vinyl ether" refers to a compound bearing at least one

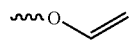

As used herein, "siloxane" refers to any compound containing a Si—O moiety. In certain embodiments, siloxanes of the invention inlcude 2 or more repeating units of Si—O.

As used herein, "aliphatic" refers to any alkyl, alkenyl, cycloalkyl, or heterocyclic moiety.

As used herein, "alkyl" refers to straight or branched chain hydrocarbyl groups having from 1 up to about 500 carbon atoms. "Substituted alkyl" refers to alkyl moieties bearing substituents including alkyl, alkenyl, alkynyl, hydroxy, oxo, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, haloalkyl, cyano, nitro, nitrone, amino, amido, —C(O)H, —C(O)—O—, —C(O)—, —S—, —S(O)$_2$—, —OC(O)—O—, —NR—C(O)—, —NR—C(O)—NR—, —OC(O)—NR—, wherein R is H or lower alkyl, acyl, oxyacyl, carboxyl, carbamate, sulfonyl, sulfonamide, sulfuryl, and the like.

As used herein, "cycloalkyl" refers to cyclic ring-containing groups containing in the range of about 3 up to about 15 carbon atoms, and "substituted cycloalkyl" refers to cycloalkyl groups further bearing one or more substituents as set forth above.

As used herein, "aryl" refers to aromatic groups having in the range of 6 up to 14 carbon atoms and "substituted aryl" refers to aryl groups further bearing one or more substituents as set forth above.

As used herein, "heterocyclic" refers to cyclic (i.e., ring-containing) groups containing one or more heteroatoms (e.g., N, O, S, or the like) as part of the ring structure, and having in the range of 3 up to 14 carbon atoms and "substituted heterocyclic" refers to heterocyclic groups further bearing one or more substituents as set forth above. The term heterocyclic is also intended to refer to heteroaromatic moieties.

As used herein, "alkenyl" refers to straight or branched chain hydrocarbyl groups having at least one carbon-carbon double bond, and having in the range of about 2 up to 500 carbon atoms, and "substituted alkenyl" refers to alkenyl groups further bearing one or more substituents as set forth above.

As used herein, "alkylene" refers to a divalent alkyl moiety, and "oxyalkylene" refers to an alkylene moiety containing at least one oxygen atom instead of a methylene (CH$_2$) unit. "Substituted alkylene" and "substituted oxyalkylene" refer to alkylene and oxyalkylene groups further bearing one or more substituents as set forth above.

As used herein, the term "phenol" includes compounds having one or more phenolic functions per molecule. The terms aliphatic, cycloaliphatic and aromatic when used to describe phenols refers to phenols to which aliphatic, cycloaliphatic and aromatic residues or combinations of these backbones are attached by direct bonding or ring fusion.

As used herein, an "alkene" or "olefin" refers to an unsaturated compound containing at least one carbon-to-carbon double bond.

"Thermoplastic," as used herein, refers to the ability of a compound, composition or other material (e.g. a plastic) to melt to a liquid when heated and freeze to solid, often brittle and glassy, state when cooled sufficiently.

"Thermoset," as used herein, refers to the ability of a compound, composition or other material to irreversibly "cure" to a stronger, harder form. Thermoset materials are typically polymers that may be cured, for example, through heat (e.g. above 200 degrees Celsius, or in the presence of appropriate catalysts at lower temperatures), via a chemical reaction (e.g. epoxy), or through irradiation (e.g. U.V. irradiation).

Thermoset materials, such as thermoset polymers or resins, are typically liquid or malleable forms prior to curing, and therefore may be molded or shaped into their final form, and/or used as adhesives. Curing transforms the thermoset resin into a infusible solid or rubber by a cross-linking process. Thus, energy and/or catalysts are added that cause the molecular chains to react at chemically active sites (unsaturated or epoxy sites, for example), linking the polymer chains into a rigid, 3-D structure. The cross-linking process forms molecules with a higher molecular weight and resultant higher melting point. During the reaction, when the molecular weight of the polymer has increased to a point such that the melting point is higher than the surrounding ambient temperature, the polymer becomes a solid material.

A "die" as used herein, refers to a small block of semiconducting material, on which a functional circuit is fabricated.

The present invention is based on the discovery that certain (meth)acrylate and maleimide-based adhesive formulations described herein are useful as adhesives for the electronic packaging industry. In particular, the adhesive formulations set forth herein are useful as low temperature curing formulations with excellent adhesion to a variety of surfaces, including silicon, polyamide, and polycarbonate solder mask. Invention formulations typically cure at temperatures less than 100° C. and have a potlife of up to about 24 hours. The formulations cure by the well-known Michael addition reaction. The Michael addition reaction is a versatile synthetic methodology for the efficient coupling of electron poor olefins, such as (meth)acrylates and maleimides, with a variety of nucleophiles, such as thiols, phenols and malonates. The addition of such nucleophiles to electron poor double bonds is catalyzed by the presence of base. The most useful base catalysts, according to the present invention, are amine catalysts.

The present invention relates generally to adhesive compositions that cure at low temperatures and can be used in various applications relating to the semiconductor industry. The invention provides one-part adhesive compositions that cure at temperatures less than 100° C. These low-temperature curing adhesive compositions, nevertheless, are stable for several hours at room temperature. This combination of properties, make them suitable for use in high volume manufacturing environments.

The cure chemistry of adhesive compositions of the present invention, which are based upon Michael addition reactions, offers significant advantages as compared to traditional epoxy-based chemistry. The (meth)acrylate and maleimide monomers described herein are chloride-free, and therefore not prone to chloride-induced corrosion of microelectronic components. Even compositions of the invention that contain combinations of epoxies, (meth)acrylates and/or maleimides have significantly reduced chloride concentrations compared to entirely epoxy-based adhesive system.

The compositions of the invention are particularly suited for is the attachment of lens holders to printed circuit boards. Lens holders are critical components in the assembly of cellular phones with built-in cameras. Adhesives that cure at low temperature permit the assembly of these devices without the risk of damage to other components on the circuit board or their corresponding bond joint attachments.

In one embodiment, the present invention provides compositions including an acrylate or a methacrylate, a polythiol, and an amine where the composition cures at a temperature of less than about 100° C. In other embodiments, compositions are provided that contain a maleimide, a polythiol, and an amine are provided, which cure at a temperature of less than about 100° C. In other embodiments, the invention provides compositions that include a polymaleimide, a polythiol, and an amine that cure at a temperature of less than about 100° C. In further embodiments, the compositions of the invention that cure at a temperature of less than about 100° C. include a (meth)acrylate, a maleimide, a polythiol, and an amine. In yet other embodiments, invention compositions that cure at a temperature of less than about 100° C. include a (meth)acrylate, a maleimide, a polythiol, an epoxy and an amine.

Certain adhesive compositions of the present invention include: (a) an electron poor olefin, including but not limited to, an acrylate, a methacrylate and/or a maleimide, optionally with at least two functional end groups per molecule; (b) a polythiol with at least two thiol groups per molecule, a polymalonate ester with two or more malonate ester residues per molecule, and/or a polyphenol with at least two phenol groups; and (c) a latent base catalyst.

Electron poor olefins suitable for use in the practice of the invention include, but are not limited to: ethoxylated bisphenol A diacrylate; dimer diol diacrylate; cyclohexanedimethanol diacrylate; 2-butyl-2-ethyl-1,3-propanediol diacrylate; 1,6-hexanediol diacrylate; trimethylene glycol diacrylate; tetraethylene glycol diacrylate; polyethylene glycol diacrylate; 1,4-butanediol diacrylate; diethylene glycol diacrylate; neopentyl glycol diacrylate; propoxylated neopentyl glycol diacrylate; tricyclodecanedimethanol diacrylate; tris (2-hydroxyethyl)isocyanurate triacrylate; pentaerythritol triacrylate; ethoxylated trimethylolpropane triacrylate; propoxylated trimethylolpropane triacrylate; glyceryl triacrylate; propoxylated glyceryl triacrylate; trimethylolpropane trimethacrylate; trimethylolpropane triacrylate; pentaerythritol tetraacrylate; di-trimethylolpropane tetraacrylate; dipentaerythritol pentaacrylate; 1,6-bismaleimido-2,2,4-trimethylhexane, 1,5-bismaleimido-2-methylpentane, 1,12-bismaleimidododecane, dimer diamine bismaleimide, zinc diacrylate, zinc dimaleimidoundecanoate, zinc dimaleimidocaproate, zinc maleimidoundecanoate-acrylate mixed salts, zinc maleimidocaproate-acrylate mixed salts, zinc maleimidoundecanoate maleimdocaproate mixed salts, calcium diacrylate, calcium dimaleimidoundecanoate, calcium dimaleimidocaproate, calcium maleimidoundecanoate-acrylate mixed salts, calcium maleimidocaproate-acrylate mixed salts, and calcium maleimidoundecanoate maleimdocaproate mixed salts. Some of the polymaleimide functional compounds shown below are commercially available, such as "BMI-2000" (polyphenylmethane maleimide; Daiwakasei Industry Co., LTD, Wakayama City, Wakayama), and "Anilix-MI" (aniline aralkyl resin; Mitsui Chemicals, Inc., Tokyo).

Maleimides contemplated for use in the practice of the invention include, but are not limited to, the bismaleimides and polymaleimides set forth below:

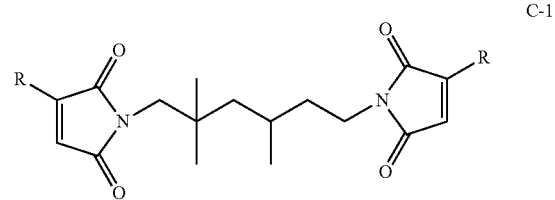

C-1 where R is H or methyl;

C-2
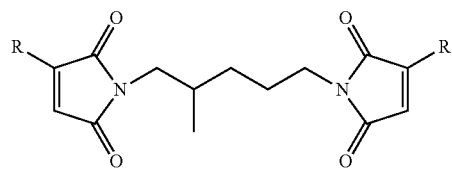
where R is H or methyl;
C-3
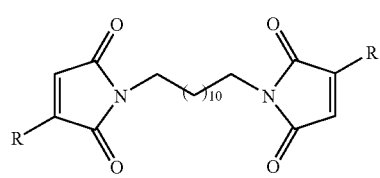
where R is H or methyl;
C-4
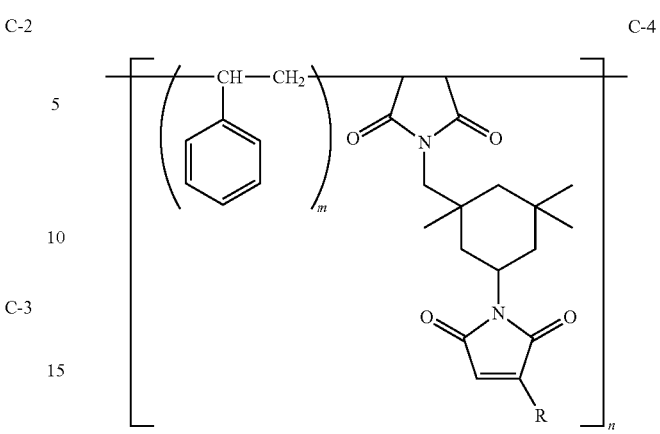
where H or methyl, m is 1 to about 10, and n is 3 to about 20;
C-5
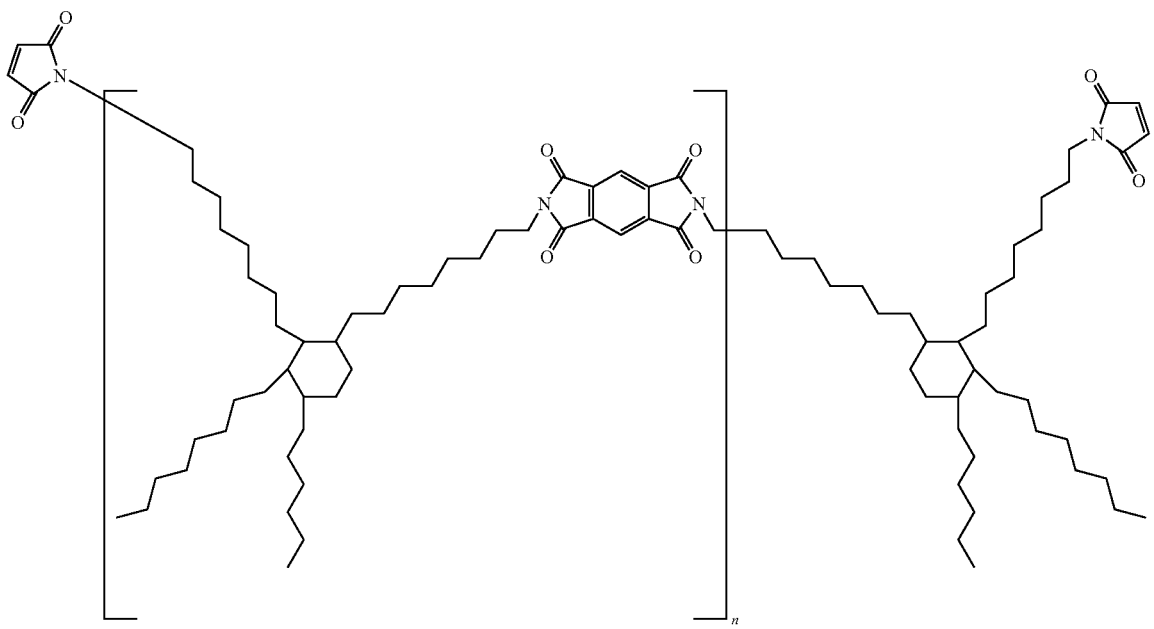
where n is 0 to about 20;
BMI-2000
where n is 0 to about 20, (available from Daiwakasei Industry Co., LTD, Wakayama City, Wakayama);

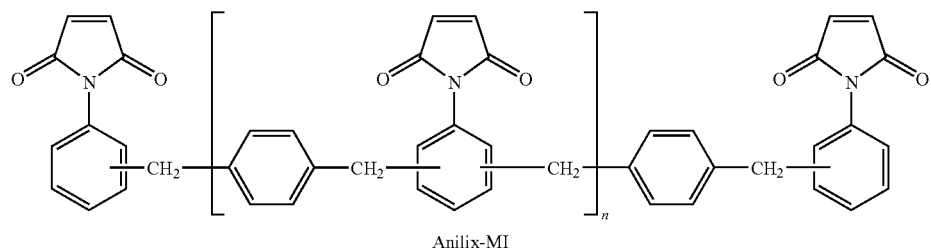

Anilix-MI where n is 0 to about 20, (available from Mitsui Chemical, Tokyo).

Nucleophiles contemplated for use in the preset invention include polythiols that have two or more thiol groups in the molecule. Examples of such molecules include, but are not limited to: trimethylolpropane tri(3-mercaptopropionate); trimethylolpropane tris-(thioglycolate); pentaerythritol tetrakis-(thioglycolate); ethyleneglycol dithioglycolate; trimethylolpropane tris-(β-thiopropionate); pentaerythritol tetrakis-(β-thiopropionate); dipentaerythritol poly(β-thiopropionate); tris(3-mercaptopropionate)triethyl-1,3,5-triazine-2,4,6-(1H,3H,5H)-trione; dimer diol bis(3-mercaptopropionate); tricyclodecanedimethanol bis(3-mercaptopropionate; cyclohexanedimethanol bis(3-mercaptopropionate); and 2-butyl-2-ethyl-1,3-propanediol bis(3-mercaptopropionate). A wide variety of additional thiol functional compounds can be readily synthesized from commercially available reagents such as 2-mercaptoethanol, 2-mercaptoacetic acid, and 3-mercaptopropionic acid. Exemplary thiol functional compounds are shown below:

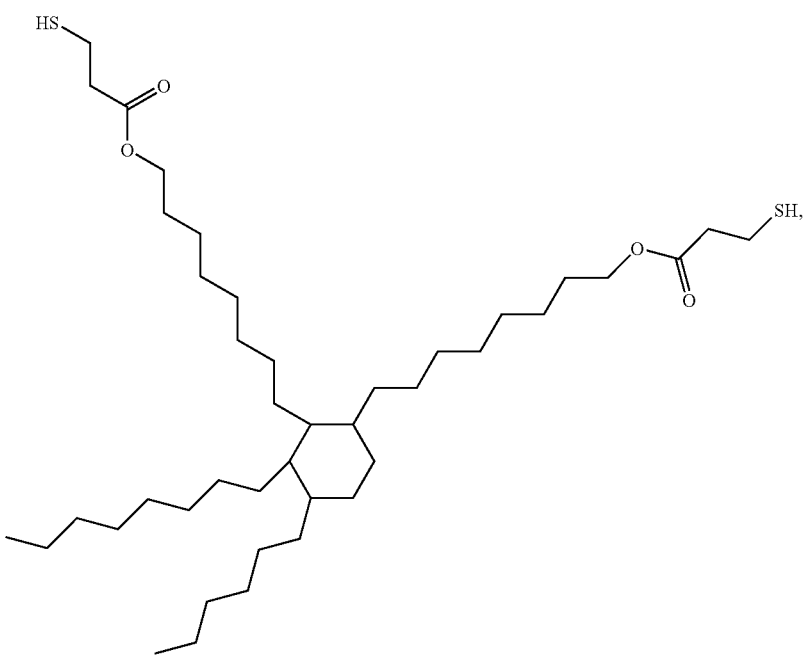

C-6

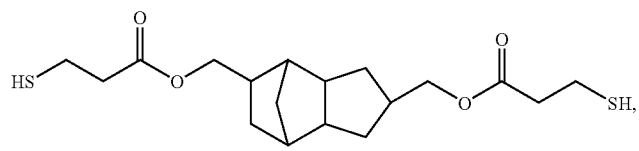

C-7

-continued

C-8

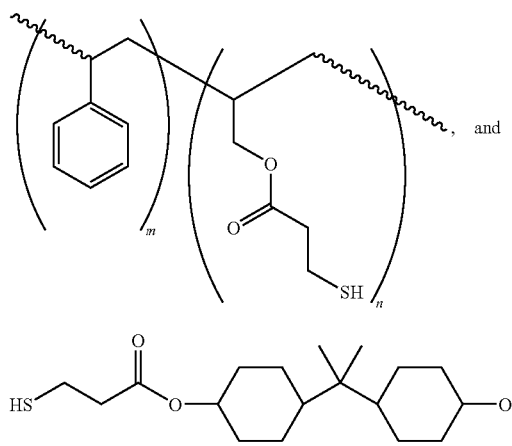

and

C-9

Additional nucleophiles contemplated for use in the present invention are polyphenols that have two or more phenol groups in the molecule. Phenols contemplated for use include, but not limited to, 2,2'-diallyl bisphenol A; ortho, ortho-diallyl bisphenol F; 2,2'-diallyl bisphenol E; 1,1,1-tris (4-hydroxyphenyl)ethane; 1,1,1-tris(4-hydroxyphenyl) methane and any non-crystalline novolac resin.

The latent base catalyst is typically a primary, secondary or tertiary amine that is insoluble in the electron poor olefin/ nucleophile mixture, but upon melting initiates the Michael addition reaction between the electron poor olefin and the nucleophile. This latent catalyst imparts extended work-life to the composition. A desirable work-life is at least several hours to about 24 hours or more. The skilled artisan will recognize that in some cases a longer or shorter work-life is desirable. Catalysts that have a plurality of tertiary amino residues in their backbones provide superior latent catalysts. Amine catalysts can be rendered even more latent by conversion to the corresponding salts. An amine can be converted to a salt by reaction with one equivalent of an acid compound. It is not necessary to convert all of the amine residues to a salt. It is possible, for example to neutralize only the peripheral amine functionality of a finely powdered amine catalyst in order to render the entire catalytic preparation more latent. The acidic compound used to make these salts may be either a Lewis or Bronsted acid. In certain embodiments, the acidic compound is a carboxylic acid. In certain aspects, superficial acid treatment of micronized polyamine catalysts can be used to render these catalysts more latent for use in the Michael addition reactions of the present invention.

Catalytic latency may also be attained through the proper selection of the physical properties of the reactive monomers, even when a relatively reactive catalyst is used. Thus, a low melting solid bis- or polymaleimide can be dispersed in a liquid polymercapto curative according to the present invention. In this aspect of the invention, little reaction will occur until the solid melts. In certain embodiments, the solid monomer has a melting point below 130° C. In other embodiments, the solid monomer has a melting point below 100° C. The physical properties of the reactive olefin and polymercapto compound may be reversed in certain aspects of the invention where the polymercapto compound may is a solid and the reactive polyolefin is a liquid that the solid is dispersed in.

Latent amine base catalysts contemplated for use in the present invention include, but are not limited to, dimethylaminopropylamine, dimethylaminododecylamine, dimethylaminotetradecylamine, dimethylaminohexadecylamine, dimethylaminooctadecylamine, diethylaminopropylamine, N,N-dipropylaminopropylamine, dibutylaminopropylamine, dimethylaminoethylamine, diethylaminoethylamine, N-methylpiperazine; primary and secondary amines that have a tertiary amino group in their molecules, such as imidazole compounds (e.g. 2-methylimidazole, 2-ethylimidazole, 2-ethyl-4-methylimidazole, 2-phenylimidazole); alcohols, phenols, thiols, carboxylic acids, and hydrazides that have a tertiary amino group, including 2-dimethylaminoethanol, 1-methyl-2-dimethylaminoethanol, 1-phenoxymethyl-2-dimethylaminoethanol, 2-diethylaminoethanol, 1-butoxymethyl-2-dimethylaminoethanol, and 1-(2-hydroxy-3-phenoxypropyl)-2-methylimidazole, 1-(2-hydroxy-3-phenoxypropyl)-2-ethyl-4-methylimidazole; 1-(2-hydroxy-3-butoxypropyl)-2-methylimidazole; 1-(2-hydroxy-3-butoxypropyl)-2-ethyl-4-methylimidazole; 1-(2-hydroxy-3-phenoxypropyl)-2-phenylimidazoline; 1-(2-hydroxy-3-butoxypropyl)-2-methylimidazoline; 2-(dimethylaminomethyl)phenol, 2,4,6-tris(dimethylaminomethyl)phenol; N-β-hydroxyethylmorpholine; 2-dimethylaminoethanethiol; 2-mercaptopyridine; 2-mercaptobenzoimidazole; 2-mercaptobenzothiazole; 4-mercaptopyridine; N,N-dimethylaminobenzoic acid; N,N-dimethylglycine; nicotinic acid; isonicotinic acid; picolinic acid; N,N-dimethylglycine hydrazide; N,N-dimethylpropionic acid hydrazide; nicotinic acid hydrazide; and isonicotinic acid hydrazide.

Commercially available amine catalysts include Ancamine® 2337S and Ancamine 2014FG (Air Products and Chemicals, Allentown, Pa.); as well as Ajicure PN-23, Ajicure PN-40, and Ajicure PN-40J (amine adduct catalysts combined with epoxy resin derived from the reaction of compounds having tertiary amino group and epoxy compounds, Ajinomoto U.S.A., Inc., Fort Lee, N.J.).

In certain embodiments, the mix ratio in the adhesive compositions according to the present invention is such that the ratio of maleimide and/or acrylate equivalents to thiol equivalents is about 0.5 to about 1.5. In other aspects, the ratio is about 0.75 to about 1.3 maleimide and/or acrylate equivalents to thiol equivalents. The level of latent amine catalyst is typically about 0.5 to about 5, parts by weight per 100 parts of the resin mixture. In certain embodiments, the latent amine catalyst is present at about 1 to about 4 parts per 100 parts by weight of the resin mixture. In yet other embodiments, the latent amine catalyst is present at about 2 to about 3 parts per 100 parts by weight of the resin mixture Any number of additives may also be added to the resin composition according to the present invention, including fillers, diluting agents, solvents, pigments, flexibilizer, coupling agents, anti-oxidants, and the like.

In a further embodiment of the invention, the present invention provides adhesives that are pastes comprising the electron poor olefin/nucleophile/base catalyst compositions described above. In some embodiments, the electron poor olefin/nucleophile/base catalyst composition is present in the adhesive paste in an amount from 2 weight percent (wt %) to about 98 wt %. In certain embodiments, the electron poor olefin/nucleophile/base catalyst composition is present in the adhesive paste at about 5 to about 75 wt %. In yet further embodiments, the electron poor olefin/nucleophile/base catalyst composition is present in the adhesive paste at about 10 to about 50 wt %. In certain aspects of the invention, the adhesive paste contains at least one additional compound that co-cures with the electron poor olefin/nucleophile/base catalyst. The additional compound is typically present in the paste at about 1 wt % to about 90 wt %; frequently at about 5 wt % to about 70 wt %; and often at about 10 wt % to about 40 wt %. Such additional compounds include, for example, epoxies, such as glycidyl ethers of bisphenol A, bisphenol F, phenolics, phenolic novolacs and cresolic novolacs; bismaleimides; polymaleimides; cyanate esters; vinyl ethers; vinyl esters; vinyl acetates; esters, olefins; styrenics; oxazolines; benzoxazines; oxetanes; and combinations thereof. Additional additives that may be present in the adhesive pastes of the invention include coupling agents, including but not limited to, titanates, zirconates, silicate esters, and metal acrylate salts. As used herein, the term "coupling agent" refers to chemical species that are capable of bonding to a mineral surface and which also contain polymerizably reactive functional group(s) so as to enable interaction with the adhesive composition and/or die-attach paste. Coupling agents thus facilitate linkage of the die-attach paste to the substrate to which it is applied.

In a further embodiment, the invention provides adhesive compositions that are die-attach pastes, which include 0.5 to about 98 wt % of at least one electron poor olefin/nucleophile/base catalyst composition of the invention, and 0 to about 90 wt % of at least one filler, and may also include a thixotrope and/or a colorant.

Fillers contemplated for use in the practice of the present invention can be electrically conductive and/or thermally conductive. In addition, the fillers may act to modify the rheology of the resulting composition. Examples of suitable electrically conductive fillers that can be employed in the practice of the present invention include, but are not limited to, silver, silver-coated copper, nickel, copper, aluminum, palladium, gold, graphite, and metal-coated graphite (e.g., nickel-coated graphite, copper-coated graphite). Examples of suitable thermally conductive fillers that can be employed in the practice of the present invention include, for example, graphite, aluminum nitride, silicon carbide, boron nitride, diamond dust, and alumina. Compounds that act primarily to modify rheology include polysiloxanes (such as polydimethyl siloxanes), silica, fumed silica, alumina, titanium dioxide, and calcium carbonate.

Fillers included in the adhesive compositions of the invention can also be non-conductive. Such non-conductive fillers include, but are not limited to calcium carbonate, silica, fused silica, fumed silica, alumina, silicon carbide, diamond, aluminum nitride, silicon nitride, boron nitride, silica coated aluminum nitride, silica coated boron nitride, silica coated silicon nitride, particles of vermiculite, mica, wollastonite, titania, sand, glass, barium sulfate, and halogenated ethylene polymers, such as polytetrafluoroethylene, polytrifluoroethylene, poly(vinylidene fluoride), poly(vinyl fluoride), poly (vinylidene chloride), and poly(vinyl chloride).

In yet another embodiment, the invention provides assemblies of components adhered together employing the above-described adhesive compositions, such as die attach pastes. Thus, for example, assemblies having a first article permanently adhered to a second article by a cured aliquot of the above-described adhesive composition are provided. Articles contemplated for assembly employing invention compositions include memory devices, ASIC devices, microprocessors, flash memory devices, and the like. Also contemplated are assemblies comprising a microelectronic device permanently adhered to a substrate by a cured aliquot of the above-described adhesive compositions, e.g., die attach paste adhesive compositions. Microelectronic devices contemplated for use with invention die attach adhesives, particularly pastes, include copper lead frames, Alloy 42 lead frames, silicon dice, gallium arsenide dice, germanium dice, and the like. Also contemplated are assemblies that include the adhesive compositions of the invention bonded to plastics, such as polyamide, polycarbonate, and the like.

In other embodiments, the invention provides methods for adhesively attaching a first article to a second article. Such methods can be performed, for example, by applying an aliquot of an adhesive composition according to the invention to the first article, the second article or both the first article and the second article; bringing the first and second articles into contact to form an assembly where the first article and the second article are separated only by the applied adhesive composition; and curing the applied adhesive composition to adhesively attach the first article to the second article.

In still further embodiments, the present invention provides methods for adhesively attaching a semiconductor device to a substrate. Such methods can be performed, for example, by applying an invention adhesive paste to the substrate, the semiconductor device or both the substrate and the semiconductor device; bringing the substrate and the device into contact to form an assembly where the substrate and the device are separated only by the applied adhesive paste; and curing the applied adhesive, thereby adhesively attaching the semiconductor device to the substrate.

In one aspect, the invention includes methods for attaching a die to a substrate using a b-stageable procedure. According to this method, an adhesive composition of the invention is applied to the die, the substrate, or both the die and the substrate. The applied adhesive is then melted and the applied, melted adhesive on the die and/or substrate which are then brought into contact, such that the die and substrate are separated only by the applied adhesive composition. Finally, the adhesive composition is cured, which attaches the die to the substrate.

The invention will now be described with reference to the following non-limiting examples.

EXAMPLES

Example 1

Preparation of Compound C-1

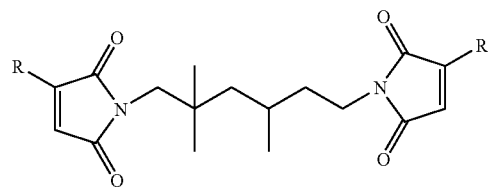

C-1

A single neck, one liter flask was charged with 60 g methanesulfonic acid, and 300 mL toluene. The flask was then charged with 45 g of anhydrous triethylamine. The mixture was magnetically stirred for five minutes and then 64.8 g (0.66 mole) maleic anhydride was added and the mixture was stirred until all of the anhydride had dissolved. An addition funnel was attached to the flask and 47.49 g (0.30 mole) 2,2,4-trimethyl-1,6-diamine was then dripped in over a twenty minute period. It was noted that the pot had to be kept at a temperature equal to or greater than 50° C. to avoid the precipitation of the bismaleamic acid as it formed. A Dean-Stark trap and condenser were then attached to the flask and the mixture was refluxed for 16.5 hours. A total of 11.0 mL water had been collected (expected 10.8 mL). The mixture was cooled to room temperature and 30 mL of deionized water was added. The upper toluene phase was decanted off and the lower phase was extracted with seven 75 mL portions of fresh toluene. The combined toluene fractions were allowed to settle overnight and then passed over 30 g of silica gel. The toluene was removed on a rotary evaporator to yield 75.7 g (79.2% of the theoretical yield) of cream colored solid. The compound was found to have a bi-modal melt at 87° C. and 110° C. An FTIR run on this compound showed absorptions at 3461, 3101, 2960, 1703, 1587, 1440, 1407, 1370, 1139, 827, and 694 wavenumbers.

Example 2

Preparation of Compound C-2

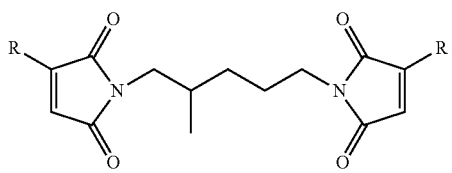

A single neck, one liter flask was charged with 80 g methanesulfonic acid, and 400 mL toluene. The flask was then charged with 64 g of anhydrous triethylamine. The mixture was magnetically stirred for five minutes and then 107.9 g (1.1 mole) maleic anhydride was added and the mixture was stirred until all of the anhydride had dissolved. An addition funnel was attached to the flask and 58.1 g (0.50 mole) 2-methyl-1,5-pentanediamine was then dripped in over a thirty minute period. It was noted that the pot had to be kept at a temperature equal to or greater than 70° C. to avoid the precipitation of the bismaleamic acid as it formed. A Dean-Stark trap and condenser were then attached to the flask and the mixture was refluxed for 63 hours. A total of 16.5 mL water had been collected (expected 18.0 mL). The mixture was cooled to room temperature and 25 mL of deionized water was added. The upper toluene phase was decanted off and the lower phase was extracted with seven 75 mL portions of fresh toluene. The combined toluene fractions were allowed to settle overnight and then passed over 50 g of silica gel. The toluene was removed on a rotary evaporator to yield 75.57 g (54.7% of theoretical yield) of what was at first a light yellow liquid. The compound froze to a light yellow solid on standing at room temperature. The compound was found to have a symmetric mono-modal melt between 92° C. and 95° C. An FTIR run on this compound showed absorptions at 3459, 3100, 2934, 1693, 1586, 1441, 1406, 1185, 1110, 825, and 695 wavenumbers.

Example 3

Preparation of Compound C-4 (m=2, n=10)

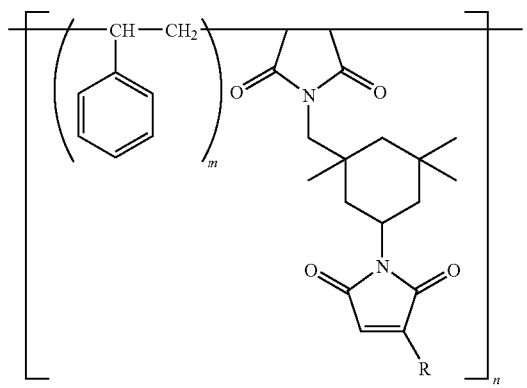

A 500 mL, single neck flask was charged with 60 mL N-methyl-2-pyrrolidone (NMP) and 30.6 g (0.1 anhydride equivalents) of SMA EF-20 styrene maleic anhydride copolymer (Sartomer Company, Inc., Exton, Pa.). This mixture was warmed and stirred magnetically until a homogeneous solution was obtained. The flask was then charged with 120 mL toluene. An addition funnel was attached to the flask and 20.4 g isophorone diamine dissolved in 60 mL toluene was dripped in over twenty-five minutes. The solution became a milky peach color and the temperature rose to about 40° C. The mixture was stirred for another ten minutes after all of the diamine had been added. The flask was then charged with 5.0 g methanesulfonic acid and then 15.7 g (0.16 mole) maleic anhydride. The flask was equipped with a Dean-Stark trap and condenser, and then heated to reflux. The mix became a clear solution about an hour after the beginning of reflux. Reflux was continued for thirty-four hours and 4.5 ml, water (expected 4.3 mL) was collected in the trap. Another 200 mL toluene was then added and the mix was neutralized using a mix of 10 g sodium bicarbonate and 5 g deionized water. The solution was dried with 10 g anhydrous magnesium sulfate and then passed over 25 g silica gel. The toluene was stripped off and the residue was re-dissolved in 300 ml, acetone. The acetone solution was then dripped into a beaker containing 1500 mL of vigorously stirred deionized water. The solid was collected and then re-dissolved in acetone and precipitated a second time. The solid was finally dried to yield 55.1 g (90.8% of theoretical yield) of a fine, off-white solid. This compound was found to have FTIR absorptions at 2927, 1778, 1704, 1601, 1371, 1220, 1146, 920, 829, 762, and 696 wavenumbers.

Example 4

Preparation of Compound C-4 (m=3, n=10)

A 500 mL, single neck flask was charged with 60 mL NMP, 41.0 g (0.1 anhydride equivalents) of SMA EF-30 (Sartomer) styrene maleic anhydride copolymer and 60 mL toluene. This mixture was warmed and stirred magnetically until a homogeneous solution was obtained. The flask was then charged with another 120 mL toluene. An addition funnel was attached to the flask and 20.4 g (0.12 mole) isophorone diamine dissolved in 60 mL toluene was dripped in over thirty minutes. The solution became a milky slurry and the temperature rose to about 40° C. The mix was stirred another ten minutes after all of the diamine had been added. The flask was then charged with 5.0 g methanesulfonic acid and then 17.7 g (0.18 mole) maleic anhydride. The flask was equipped with a Dean-Stark trap and condenser and then heated to reflux. The mix became a clear solution about thirty minutes after the beginning of reflux. Reflux was continued for forty-eight hours and 4.9 mL water (expected 4.3) was collected in the trap. Another 200 mL toluene was then added and the mix was neutralized using a mix of 15 g sodium bicarbonate and 5 g deionized. water. The solution was dried with 15 g anhydrous magnesium sulfate and then passed over 30 g silica gel. The toluene was stripped off and the residue was re-dissolved in 250 mL acetone. The acetone solution was then dripped into a beaker containing 1600 mL of vigorously stirred deionized water. The solid was collected via vacuum filtration onto a fritted funnel. The solid was finally dried to yield 69.62 g (97.9% of theoretical yield) of a fine, off-white solid. This compound was found to have FTIR absorptions at 2927, 1777, 1695, 1601, 1363, 1220, 1146, 921, 829, 761, and 697 wavenumbers.

Example 5

Preparation of Compound C-6

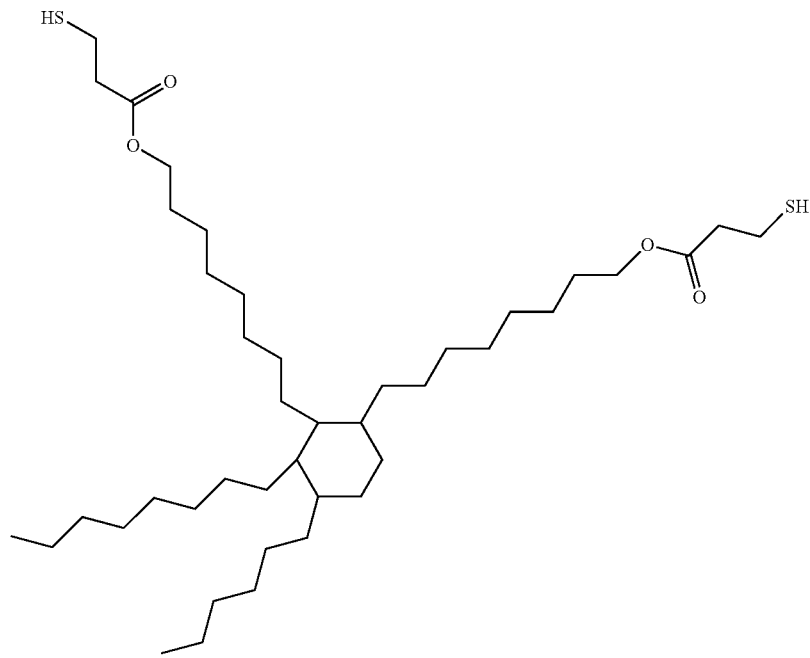

C-6

A 500 mL, two-neck flask was charged with 53.7 g (0.10 mole) dimer diol, 23.35 g (0.220 mole) 3-mercaptopropionic acid and 50 mL toluene. The flask was equipped with a stir bar, a Dean-Stark trap, a thermocouple probe, a condenser and a bubbler. The flask was placed in an oil bath and swept at room temperature with argon gas. The flask was then stirred and heated to achieve a pot temperature of 155° C. (about twenty mL of toluene had to be removed to attain this temperature). Water from the condensation reaction was removed azeotropically. A total of 3.1 mL water had been removed after 3.5 hours of reflux. The reaction was allowed to continue overnight (another 13.5 hours) and a total of 3.8 mL water (3.6 mL expected) was collected. The remaining toluene was distilled off and the excess 3-mercaptopropionic acid was sparged out of the product using a vigorous argon stream while holding the bath temperature at 155° C. The final product was a moderately viscous, clear, light yellow liquid that weighed 71.02 g (99.6% of theoretical yield). An FTIR scan run on this compound revealed prominent absorptions at 2924, 2852, 1736, 1464, 1354, 1246, 1158, and 723 wavenumbers. Thermogravimetric analysis (10° C. per minute, air purge) on the neat compound showed 100.0%, 99.8% and 98.0% retained weight at 100, 200, and 300° C., respectively. The decomposition onset was 363.8° C.

Example 6

Trimethylolpropane Tri(3-Mercaptopropionate)/Ethoxylated Bisphenol A Diacrylate Formulation An exemplary formulation was prepared containing trimethylolpropane tri(3-mercaptopropionate) (36%), SR349 (ethoxylated bisphenol A diacrylate, 64%), Ancamine (4%), R202 fumed silica (4%). The formulation was oven-cured at 70° C. for 30 minutes. The die shear data obtained are summarized in Table 1, below.

TABLE 1

Die Shear of Trimethylolpropane Tri(3-Mercaptopropionate/ Ethoxylated Bisphenol A Diacrylate Formulation at Room Temperature and at 200° C.

| Room Temp Die Shear $150^2$ 14 mil die on ceramic | 200° C. Die Shear $150^2$ 14 mil die on ceramic |
|---|---|
| 11.03 | 2.09 |
| 11.19 | 1.65 |
| 8.22 | 1.89 |
| 9.56 | 2.01 |

TABLE 1-continued

Die Shear of Trimethylolpropane Tri(3-Mercaptopropionate)/
Ethoxylated Bisphenol A Diacrylate Formulation at Room
Temperature and at 200° C.

| Room Temp Die Shear $150^2$ 14 mil die on ceramic | 200° C. Die Shear $150^2$ 14 mil die on ceramic |
|---|---|
| 9.25 | 1.90 |
| 5.75 | 2.11 |
| x = 9.17 ± 2.01 kgf | x = 1.94 ± 0.17 kgf |

Example 7

Trimethylolpropane Tri(3-Mercaptopropionate)/1,5-Bismaleimido-2 Methyl Pentane/1,6-Bismaleimido-Trimethyl Hexane An exemplary formulation was prepared containing trimethylolpropane tri(3-mercaptopropionate) (47%), 1,5-bismaleimido-2 methyl pentane (compound C-2; 24%), 1,6-bismaleimido-trimethyl hexane (compound C-1; 28%), Ancamine 2337S (1%). The formulation was oven-cured at 80° C. for 30 minutes. The die shear data obtained are summarized in Table 2, below.

TABLE 2

Die Shear of Trimethylolpropane Tri(3-Mercaptopropionate/
1,5-Bismaleimido-2 Methyl Pentane/1,6-Bismaleimido-
Trimethyl Hexane at Room Temperature
Room Temp Die Shear
$150^2$ 14 mil silicon die on ceramic

| |
|---|
| 45.6 kgf |
| 49.6 kgf |
| 48.4 kgf |
| 48.4 kgf |
| 46.5 kgf |
| 33.8 kgf |
| 36.5 kgf |
| 32.9 kgf |
| Average = 42.7 ± 7.1 kgf |

Example 8

Trimethylolpropane Tri(3-Mercaptopropionate)/Polymaleimide/1,6-Bismaleimido-Trimethyl Hexane Formulation An exemplary formulation was prepared containing trimethylolpropane tri(3-mercaptopropionate) (25.2%), polymaleimide (compound C-4, where m=2 and n=10; 30.5%), 1,6-bismaleimido-trimethyl hexane (compound C-1; 20.3%), SR349 (20.2%), Ancamine 2337S (1.5%), and SR638 (zinc diacrylate, 2.3%). Eight parts were assembled using 150×150×14 mil silicon die on ceramic substrates using this adhesive composition. The parts were oven cured at 80° C. for thirty minutes and then tested for adhesion using die shear. The average room temperature adhesion was 13.04±0.4 kgf.

Example 9

Trimethylolpropane Tri(3-Mercaptopropionate)/Polymaleimide/1,6-Bismaleimido-Trimethyl Hexane Formulation An exemplary formulation was prepared containing trimethylolpropane tri(3-mercaptopropionate) (23.4%), polymaleimide (compound C-4 where m=3 and n=10, 30.3%), 1,6-bismaleimido-trimethyl hexane (compound C-1, 19.3%), SR349 (23.3%), Ancamine 2337S (1.5%), and SR638 (zinc diacrylate, 2.2%). Eight parts were assembled with 150×150×14 mil silicon die on ceramic substrates using this adhesive composition. The parts were oven cured at 80° C. for thirty minutes and then tested for adhesion using die shear. The average room temperature adhesion was 19.3±0.3 kgf.

Example 10

Trimethylolpropane Tri(3-Mercaptopropionate)/1,6-Bismaleimido-Trimethyl Hexane/Imide-Extended Bismaleimide Formulation An exemplary formulation was prepared containing trimethylolpropane tri(3-mercaptopropionate) (41.1%), 1,6-bismaleimido-trimethyl hexane (compound C-1, 52.28%), imide-extended bismaleimide (compound C-5 where n=1, 2.75%), Ancamine 2337S (1.84%), and SR638 (zinc diacrylate, 2.01%). Twenty-six parts were assembled with 150×150×14 mil silicon die on ceramic substrates using this adhesive composition. The first six parts were cured on a hot plate set at 80° C. for five minutes; the average room temperature die shear adhesion for this set was 39.4±1.6 kgf. A second set of six parts was cured for fifteen minutes at 80° C.; the average adhesion for this set was 39.3±1.5 kgf. A third set of eight parts was cured at 80° C. for thirty minutes; the average adhesion for this set was 50.9±4.0 kgf. Finally, a fourth set of six parts was cured at 80° C. for thirty minutes in an oven; the average room temperature adhesion for this set was 59.6±3.8 kgf.

While this invention has been described with respect to these specific examples, it should be clear that other modifications and variations would be possible without departing from the spirit of this invention.

What is claimed is:

1. An adhesive composition comprising an electron poor olefin comprising at least one maleimide or at least one (meth)acrylate, a nucleophile, and a base catalyst, wherein the composition is a one-part composition that cures by Michael addition at a temperature of between about 50° C. and about 100° C., wherein the (meth)acrylate is selected from the group consisting of zinc diacrylate, calcium diacrylate, trimethylolpropane trimethacrylate, trimethylolpropane triacrylate, pentaerythritol tetraacrylate, tricyclodecanedimethanol diacrylate, 2-butyl-2-ethyl-1,3-propanediol diacrylate, ditrimethylolpropane tetraacrylate and dipentaerythritol pentaacrylate.

2. The adhesive composition of claim 1, wherein the molar ratio of (meth)acrylate and maleimide equivalents to the nucleophile equivalents is between about 0.75 and about 1.3.

3. The adhesive composition of claim 1, wherein the at least one maleimide comprises at least two ethylenically unsaturated end groups per molecule.

4. The adhesive composition of claim 1, wherein the at least one maleimide is 1,5-bismaleimido-2-methyl pentane or 1,6-bismaleimido-trimethyl hexane having the structure

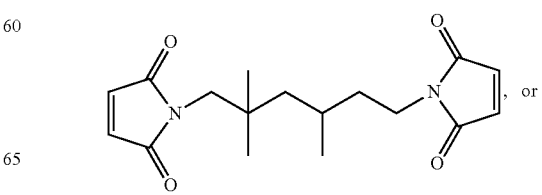

-continued

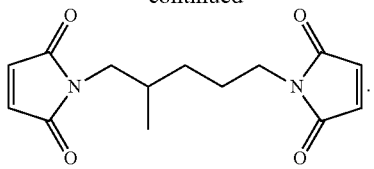

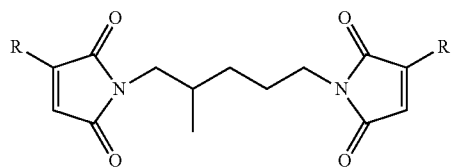

II

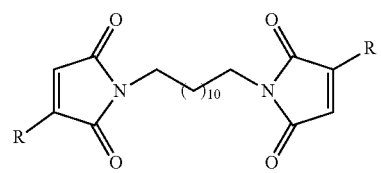

III

5. The adhesive composition of claim 1, wherein the electron poor olefin comprises at least one of trimethylolpropane triacrylate, pentaerythritol tetraacrylate, 1,6-bismaleimido-2,2,4- trimethylhexane, 1,5-bismaleimido-2-methylpentane, 1,12-bismaleimidododecane, dimer diamine bismaleimide, zinc dimaleimidoundecanoate, zinc dimaleimidocaproate, zinc maleimidoundecanoate-acrylate mixed salt, zinc maleimidocaproate-acrylate mixed salt, zinc maleimidoundecanoate maleimdocaproate mixed salt, calcium dimaleimidoundecanoate, calcium dimaleimidocaproate, calcium maleimidoundecanoate-acrylate mixed salt, calcium maleimidocaproate-acrylate mixed salt and calcium maleimidoundecanoate maleimdocaproate mixed salt.

6. An adhesive composition, comprising an electron poor olefin, a nucleophile, and a base catalyst, wherein the composition cures by Michael addition at a temperature of between about 50° C. and about 100° C. and wherein the electron poor olefin comprises at least one of compound represented by any of formulae I-VII:

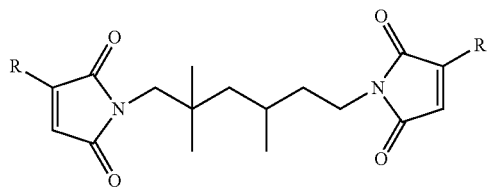

I

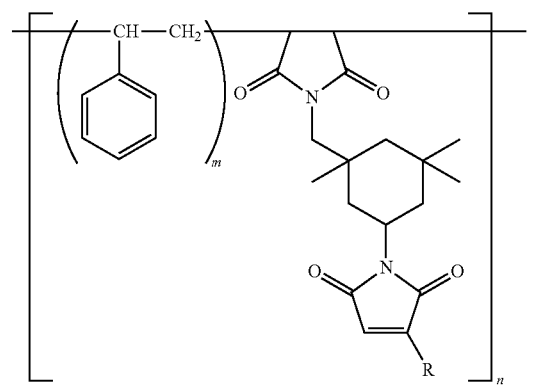

IV wherein in each of the formulae I-IV:
R is independently selected from the group consisting of H and methyl,
m is an integer having the value between 1 and about 10, and
n is an integer having the value between 3 and about 20;

V

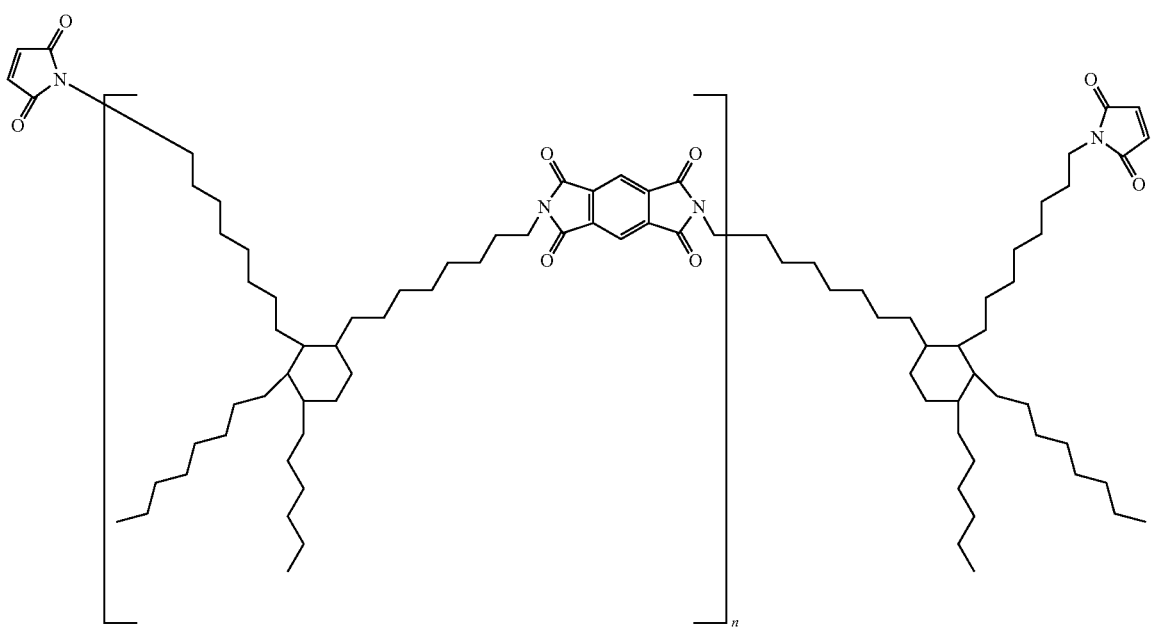

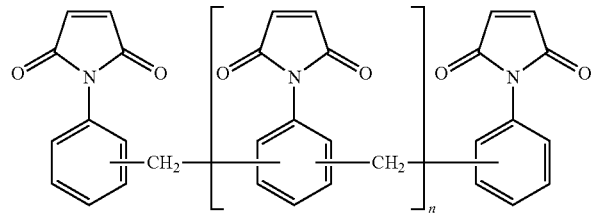

VI

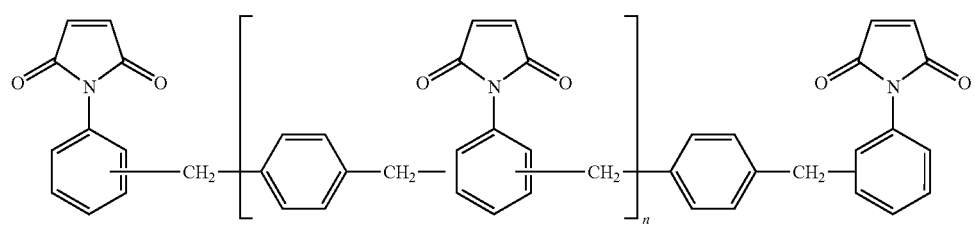

VII wherein in each of the formulae V-VII n is an integer having the value between 0 and about 20.

7. An adhesive composition, comprising an electron poor olefin comprising at least one maleimide or at least one (meth)acrylate, a nucleophile, and a base catalyst, wherein:
(a) the composition cures by Michael addition at a temperature of between about 50° C. and about 100° C.;
b) the (meth)acrylate is selected from the group consisting of zinc diacrylate, calcium diacrylate, trimethylolpropane trimethacrylate, tricyclodecanedimethanol diacrylate, 2-butyl-2-ethyl-1,3-propanediol diacrylate, ditrimethylolpropane tetraacrylate and dipentaerythritol pentaacrylate; and
(c) the nucleophile comprises at least one of a thiol, a phenol, a malonate, a polythiol comprising at least two thiol groups, and a polyphenol comprising at least two phenol groups.

8. An adhesive composition, comprising an electron poor olefin, a nucleophile comprising at least one thiol, and a base catalyst, wherein the composition cures by Michael addition at a temperature of between about 50° C. and about 100° C., wherein the thiol comprises at least one compound selected from the group consisting of:

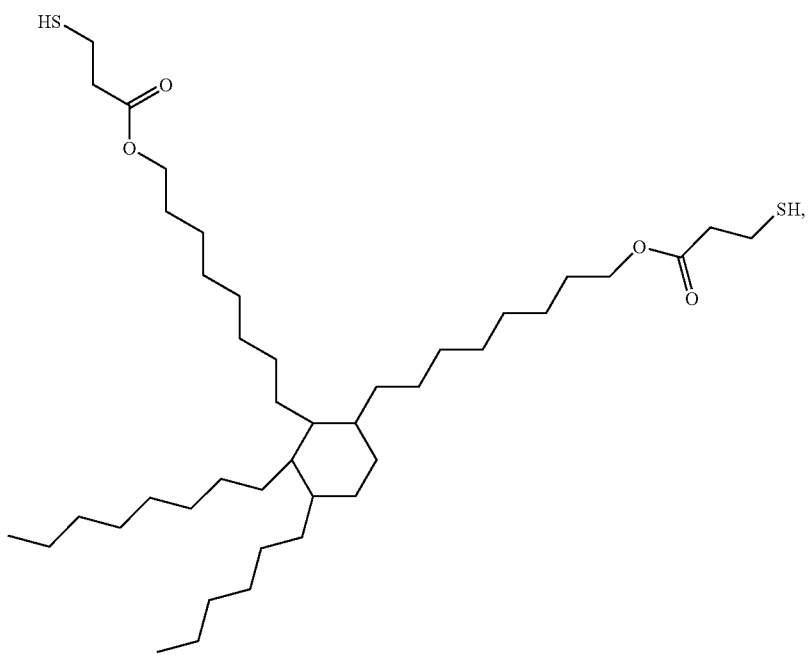

-continued

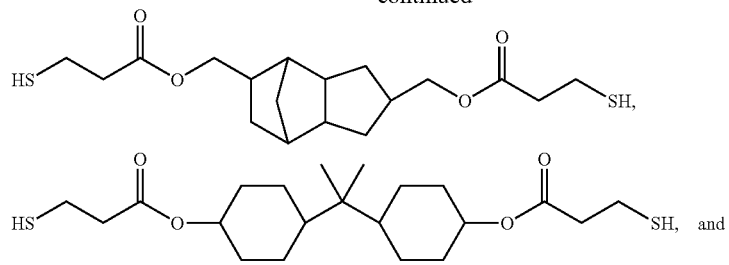

a compound represented by the formula:

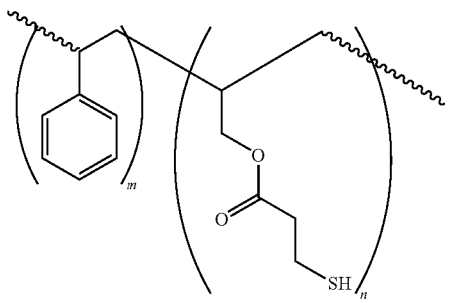

wherein:
m is an integer having the value between 1 and about 10, and
n is an integer having the value between 3 and about 20.

9. The adhesive composition of claim 1, wherein the base catalyst is an amine.

10. The adhesive composition of claim 9, wherein the amine is selected from the group consisting of a primary amine, a secondary amine, a tertiary amine, a micronized polyamine superficially treated with acid, an amine, an imidazole or a hydrazide comprising at least one tertiary amino residue in its backbone, dimethylaminopropylamine, dimethylaminododecylamine, dimethylaminotetradecylamine, dimethylaminohexadecylamine, dimethylaminooctadecylamine, diethylaminopropylamine, N,N-dipropylaminopropylamine, dibutylaminopropylamine, dimethylaminoethylamine, diethylaminoethylamine, N-methylpiperazine, 2-methylimidazole, 2-ethylimidazole, 2-ethyl-4-methylimidazole, 2-phenylimidazole, 2-dimethylaminoethanol, 1-methyl-2-dimethylaminoethanol, 1-phenoxymethyl-2-dimethylaminoethanol, 2-diethylaminoethanol, 1-butoxymethyl-2-dimethylaminoethanol, 1-(2-hydroxy-3-phenoxypropyl)-2-methylimidazole, 1-(2-hydroxy-3-phenoxypropyl)-2-ethyl-4-methylimidazole, 1-(2-hydroxy-3-butoxypropyl)-2-methylimidazole, 1-(2-hydroxy-3-butoxypropyl)-2-ethyl-4-methylimidazole, 1-(2-hydroxy-3-phenoxypropyl)-2-phenylimidazoline, 1-(2-hydroxy-3-butoxypropyl)-2-methylimidazoline, 2-(dimethylaminomethyl)phenol, 2,4,6-tris(dimethylaminomethyl)phenol, N-β-hydroxyethylmorpholine, 2-dimethylaminoethanethiol, 2-mercaptopyridine, 2-mercaptobenzoimidazole, 2-mercaptobenzothiazole, 4-mercaptopyridine, N,N-dimethylaminobenzoic acid, N,N-dimethylglycine, nicotinic acid, isonicotinic acid, picolinic acid, N,N-dimethylglycine hydrazide, N,N-dimethylpropionic acid hydrazide, nicotinic acid hydrazide and isonicotinic acid hydrazide.

11. An adhesive composition, comprising an electron poor olefin comprising at least one maleimide or at least one (meth)acrylate, a nucleophile, and a base catalyst, wherein:

(a) the composition cures by Michael addition at a temperature of between about 50° C. and about 100° C.;
(b) the (meth)acrylate is selected from the group consisting of zinc diacrylate, calcium diacrylate, trimethylolpropane trimethacrylate, tricyclodecanedimethanol diacrylate, 2-butyl-2-ethyl-1,3-propanediol diacrylate, ditrimethylolpropane tetraacrylate and dipentaerythritol pentaacrylate; and
(c) the catalyst is an amine that is converted to a salt by the addition of an acid compound prior to the commencement of the process of curing of the composition.

12. The adhesive composition of claim 1, further comprising at least one reactive diluent, filler, coupling agent, or at least one compound selected from the group consisting of an epoxy, a phenolic, a novolac, a bismaleimide, a polymaleimide, a cyanate ester; a vinyl ether, a vinyl ester, an ester, an olefin, a styrenic, an allyl functional compound, a thixotrope, a colorant, an oxazoline, a benzoxazine, an oxetane, a titanate, a zirconate, a silicate ester and a metal acrylate salt.

13. The adhesive composition of claim 12, wherein the filler is non-conductive.

14. The adhesive composition of claim 12, wherein the coupling agent comprises a silicate ester, a metal acrylate salt, zirconate, a titanate, sulfur-containing silicate ester, or an epoxy containing silicate ester.

15. The adhesive composition of claim 6, wherein the electron poor olefin comprises at least one compound having the structure I or II.

16. The adhesive composition of claim 6, wherein the catalyst is an amine that is converted to a salt by the addition of an acid compound prior to the commencement of the process of curing of the composition.

17. The adhesive composition of claim 8, further comprising at least one reactive diluent, filler, coupling agent, or at least one compound selected from the group consisting of an epoxy, a phenolic, a novolac, a bismaleimide, a polymaleimide, a cyanate ester; a vinyl ether, a vinyl ester, an ester, an olefin, a styrenic, an allyl functional compound, a thixotrope, a colorant, an oxazoline, a benzoxazine, an oxetane, a titanate, a zirconate, a silicate ester and a metal acrylate salt.

18. The adhesive composition of claim 17, wherein the reactive diluent is an epoxy, a maleimide, an acrylate, a methacrylate, or a styrenic.

19. The adhesive composition of claim 17, wherein the filler is non-conductive.

20. The adhesive composition of claim 17, wherein the coupling agent comprises a silicate ester, a metal acrylate salt, zirconate, a titanate, sulfur-containing silicate ester, or an epoxy containing silicate ester.

* * * * *